(12) United States Patent
Shim (10) Patent No.: US 9,575,663 B2
(45) Date of Patent: Feb. 21, 2017

(54) SOLID STATE DRIVE AND OPERATION METHOD THEREOF

(71) Applicant: Samsung Electronics Co., Ltd., Suwon-si, Gyeonggi-do (KR)

(72) Inventor: In Bo Shim, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 78 days.

(21) Appl. No.: 14/607,717

(22) Filed: Jan. 28, 2015

(65) Prior Publication Data

US 2015/0355839 A1    Dec. 10, 2015

(30) Foreign Application Priority Data

Jun. 9, 2014    (KR) .................. 10-2014-0069374

(51) Int. Cl.

| | |
|---|---|
| *G06F 12/00* | (2006.01) |
| *G06F 3/06* | (2006.01) |
| *G11C 11/406* | (2006.01) |
| *G11C 8/12* | (2006.01) |
| *G11C 16/22* | (2006.01) |
| *G11C 14/00* | (2006.01) |

(52) U.S. Cl.
CPC .............. *G06F 3/061* (2013.01); *G06F 3/068* (2013.01); *G06F 3/0625* (2013.01); *G06F 3/0659* (2013.01); *G11C 8/12* (2013.01); *G11C 11/40607* (2013.01); *G11C 11/40615* (2013.01); *G11C 11/40618* (2013.01); *G11C 14/0009* (2013.01); *G11C 16/225* (2013.01)

(58) Field of Classification Search
CPC ...... G06F 3/061; G06F 3/0625; G06F 3/0659; G06F 3/068
See application file for complete search history.

(56) References Cited

U.S. PATENT DOCUMENTS

| | | |
|---|---|---|
| 6,343,043 B2 | 1/2002 | Kai et al. |
| 6,381,188 B1 | 4/2002 | Choi et al. |
| 6,560,158 B2 | 5/2003 | Choi et al. |
| 6,934,211 B2 | 8/2005 | Hazama et al. |
| 6,992,943 B2 | 1/2006 | Hwang et al. |
| 7,180,806 B2 | 2/2007 | Ikeda et al. |
| 7,460,428 B2 | 12/2008 | Joo et al. |
| 8,094,512 B2 | 1/2012 | Fukiage |

(Continued)

FOREIGN PATENT DOCUMENTS

| | | |
|---|---|---|
| JP | 2007-317176 | 12/2007 |
| JP | 2012-133638 | 7/2012 |
| KR | 1020030009100 A | 1/2003 |

*Primary Examiner* — Yong Choe
(74) *Attorney, Agent, or Firm* — Myers Bigel, P.A.

(57) ABSTRACT

A solid state drive in accordance with embodiments of the present inventive concepts may include a nonvolatile memory, a volatile memory, a memory controller controlling the nonvolatile memory and the volatile memory, and a power generator providing power to the nonvolatile memory, the volatile memory, and the memory controller. A method of operating the solid state drive may include designating a bank that will perform a self refresh among a plurality of banks included in the volatile memory in response to a power saving mode signal. Information of the designated bank may be stored in a register in response to a command and an address signal; and a self refresh of the designated bank may be performed on the basis of the information stored in the register.

16 Claims, 9 Drawing Sheets

(56) References Cited

U.S. PATENT DOCUMENTS

| | | |
|---|---|---|
| 8,441,879 B2 | 5/2013 | Ichimura |
| 2004/0093461 A1 | 5/2004 | Kim |
| 2006/0104139 A1* | 5/2006 | Hur .................... G11C 11/406 |
| | | 365/222 |
| 2013/0070539 A1 | 3/2013 | Kim et al. |
| 2014/0331034 A1* | 11/2014 | Ponce ................. G06F 9/4401 |
| | | 713/1 |

* cited by examiner

| BANK AREA | DATA |
|-----------|------|
| BANK1 | D1 |
| BANK2 | – |
| BANK3 | – |
| BANK4 | D2 |

| Self Refresh State | Bank Area |
|---|---|
| Active | BANK1 |
| Inactive | BANK2 |
| Inactive | BANK3 |
| Active | BANK4 |

| BANK | DATA |
|---|---|
| BANK1 | D5 |
| BANK2 | D6 |
| BANK3 | D7 |
| BANK4 | D8 |

| Self Refresh State | BANK AREA |
|---|---|
| Inactive | BANK1 |
| Inactive | BANK2 |
| Active | BANK3 |
| Inactive | BANK4 |

SOLID STATE DRIVE AND OPERATION METHOD THEREOF

CROSS-REFERENCE TO RELATED APPLICATIONS

This U.S. non-provisional patent application claims priority under 35 U.S.C. §119 of Korean Patent Application No. 10-2014-0069374, filed on Jun. 9, 2014, the entire contents of which are hereby incorporated by reference.

BACKGROUND

Semiconductor memory devices such as DRAM memory devices can experience the dissipation of charges stored in a cell capacitor in the form of leakage current. Thus, a refresh operation of reading out data stored in a DRAM and then writing the data again periodically before the data completely disappears may be needed.

In the case that a computer is in a sleep mode, most internal devices are turned off but a DRAM is turned on for data retention. In this case, a DRAM performs a self refresh operation to retain data.

To further strengthen the low power consumption of a notebook, a smart phone, etc. that operates by a battery, a method of reducing power consumption in a DRAM may be useful.

SUMMARY

Embodiments of the present inventive concepts provide solid state drives. The solid state drives may include a nonvolatile memory, a volatile memory, and a memory controller controlling the nonvolatile memory and the volatile memory. A method of operating the solid state drive can include designating a bank that will perform a self refresh among a plurality of banks included in the volatile memory in response to a power saving mode signal. Information of the designated bank may be stored in a register in response to a command and an address signal. A self refresh of the designated bank may be performed on the basis of the information stored in the register. The power saving mode signal can be a signal external to the solid state drive.

In some embodiments of the present inventive concepts, the solid state drive can include a power generator providing power to the nonvolatile memory, the volatile memory, and the memory controller. The method of operating the solid state drive can further include cutting off power from the power generator to the memory controller and the nonvolatile memory after the power saving mode signal is activated and then a predetermined time has elapsed.

In some embodiments of the present inventive concepts, the method of operating the solid state drive can include storing data in the designated bank among the plurality of banks in response to the command and the address signal.

In some embodiments of the present inventive concepts, the method of operating the solid state drive can include outputting the command and the address signal from the memory controller, and designating, as the power saving mode signal is activated, a bank that will perform the self refresh among the plurality of banks.

In some embodiments of the present inventive concepts, the method of operating the solid state drive can include detecting a bank including unrestorable data among the plurality of bans included in the volatile memory in response to the power saving mode signal, and determining a bank that will perform the self refresh among the plurality of banks on the basis of the detection result.

In some embodiments of the present inventive concepts, the method of operating the solid state drive can include outputting the command and the address signal and setting the register according to the address signal.

Embodiments of the inventive concepts may provide a solid state drive. The solid state drive may include a nonvolatile memory, a volatile memory, a memory controller controlling the nonvolatile memory and the volatile memory, and a power generator providing power to the nonvolatile memory, the volatile memory, and the memory controller. The volatile memory can be configured to perform a self refresh on a designated bank among the plurality of banks in response to a command and an address signal. The memory controller can be configured to control write, read, and erase operations of the nonvolatile memory, designate the bank that will perform a self refresh among the plurality of banks in response to a power saving mode signal, and output the command and the address signal on the basis of the designated bank. The power generator can be configured to supply power according to the power saving mode signal. The power saving mode signal can be a signal external to the solid id state drive.

In some embodiments of the present inventive concepts, the solid state drive can include a self refresh circuit configured to output a refresh control signal and a refresh area signal in response to the command and the address signal, and a memory circuit configured to perform a self refresh on the designated bank in response to the refresh control signal and the refresh area signal.

In some embodiments of the present inventive concepts, the solid state drive can include a register configured to store information of the designated bank.

In some embodiments of the present inventive concepts, the solid state drive can include a self refresh command signal and a write command signal. The self refresh circuit can be configured to output the refresh control signal in an activation state in response to the self refresh command signal and a deactivation state in response to the write command signal.

In some embodiments of the present inventive concepts, the solid state drive can include a write command signal which includes first and second write command signals. The first write command signal can be output to the self refresh circuit and the second write command signal can be output to the memory circuit.

In some embodiments of the present inventive concepts, the self refresh circuit can be configured to set the register according to the address signal in response to the first write command signal.

In some embodiments of the present inventive concepts, the memory controller can be further configured to output data to the memory circuit. The memory circuit can be configured to store the data output from the memory controller in the designated bank according to the address signal in response to the second write command signal.

In some embodiments of the present inventive concepts, after the power saving mode signal is activated and then a predetermined time has elapsed, the power generator can be configured to cut off power of the memory controller and the nonvolatile memory.

In some embodiments of the present inventive concepts, the memory controller can be configured to back up data to the designated bank during the predetermined time.

Embodiments of the inventive concept also provide a memory device. The device may include a memory circuit comprising a plurality of memory banks of volatile memory and a self refresh circuit configured to provide a refresh signal to the memory circuit. The self refresh circuit can be configured to determine a selected memory bank of the plurality of memory banks for a self refresh operation to refresh data of the selected memory bank. Responsive to the refresh signal, the memory circuit can be configured to provide a self refresh operation to refresh data of the selected bank and to not provide a self refresh operation to an unselected bank of the plurality of memory banks. Thus, data stored in a selected bank may be maintained while data stored in an unselected bank may not be maintained.

In some embodiments of the present inventive concepts, the refresh signal of the memory device can include a refresh control signal and a refresh area signal. The refresh control signal can determine an activation state or a deactivation state of the self refresh operation of the volatile memory device. The refresh area signal is a signal designating the selected bank of the plurality of memory banks for the self refresh operation to refresh data of the selected memory bank. More than one bank may be designated by the refresh area signal.

In some embodiments of the present inventive concepts, the self refresh circuit can include a register. The register can contain data which corresponds to the determination of the selected memory bank of the plurality of memory banks for the self refresh operation to refresh data of the selected memory bank. The data in the register may designate more than one bank of the plurality of memory banks for the self refresh operation.

In some embodiments of the present inventive concepts, the self refresh circuit further includes an interface to a memory controller. The self refresh circuit can store information in the register responsive to a signal received by the self refresh circuit on the interface to the memory controller.

In some embodiments of the present inventive concepts, the signal received by the self refresh circuit on the interface to the memory controller can include a command signal and an address signal.

BRIEF DESCRIPTION OF THE FIGURES

Embodiments of the present inventive concepts will be described below in more detail with reference to the accompanying drawings. The embodiments of the present inventive concepts may, however, be embodied in different forms and should not be construed as limited to the embodiments set forth herein. Rather, these embodiments are provided so that this disclosure will be thorough and complete, and will fully convey the scope of the present inventive concepts to those skilled in the art. Like numbers refer to like elements throughout.

DETAILED DESCRIPTION

Embodiments of the present inventive concepts will be described more fully hereinafter with reference to the accompanying drawings, in which embodiments of the present inventive concepts are shown. These inventive concepts may, however, be embodied in many different forms and should not be construed as limited to the embodiments set forth herein. Rather, these embodiments are provided so that this disclosure will be thorough and complete, and will fully convey the scope of the present inventive concepts to those skilled in the art. In the drawings, the size and relative sizes of layers and regions may be exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

It will be further understood that when an element is referred to as being "connected" or "coupled" to another element, it may be directly connected or coupled to the other element or intervening elements may be present, in contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
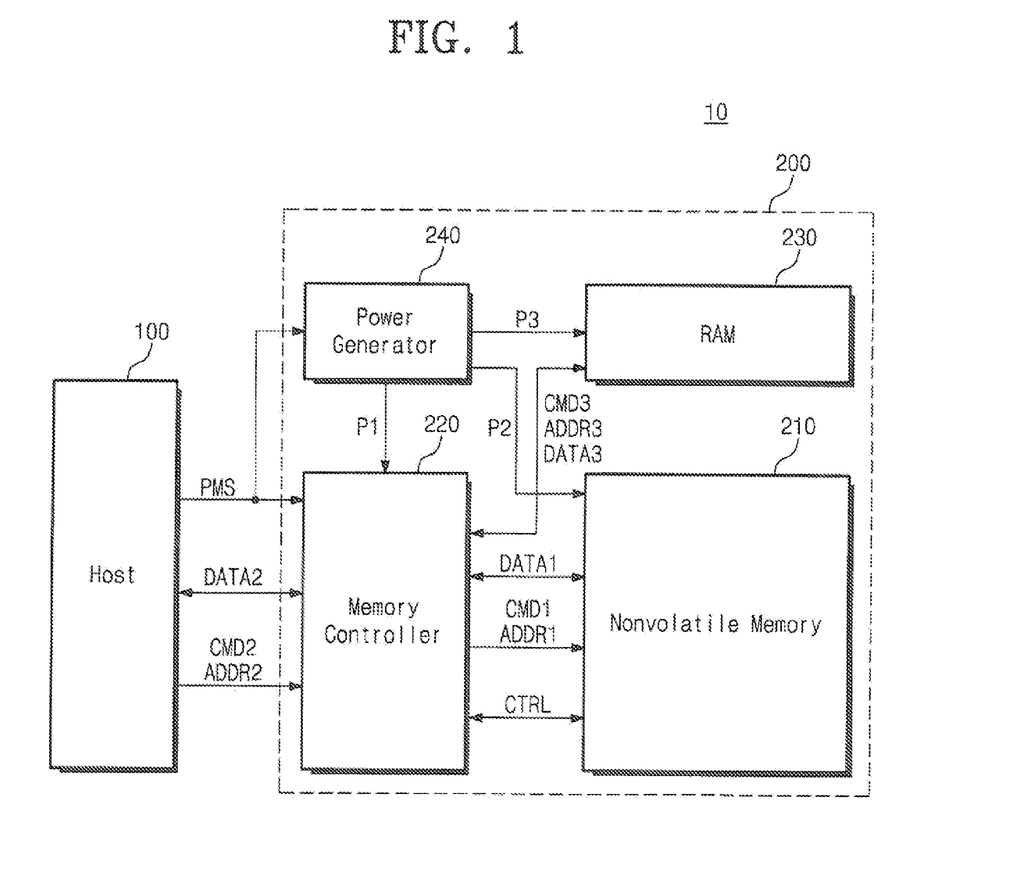
FIG. 1 is a block diagram illustrating computing systems in accordance with some embodiments of the present inventive concepts.

FIG. 1 is a block diagram illustrating computing systems in accordance with some embodiments of the present inventive concepts.

Referring to FIG. 1, the computing system 10 can include a host device 100 and a data storage device 200.

The host device 100 can store and read out data using the data storage device 200. The host device 100 can store data in the data storage device 200, read data from the data storage device 200, and erase data stored in the data storage device 200. For example, the host device 100 may include a general purpose computer, a special purpose computer, a smart phone, a smart pad, and a smart television, etc.

The data storage device 200 can perform read, write, and erase operations according to a control of the host device 100. The data storage device 200 can be supplied with power from the host device 100 and exchange a plurality of signals with the host device 100.

According to some embodiments of the present inventive concepts, the data storage device 200 may be a solid state drive that can combine with or be detached from the host device 100.

The data storage device 200 includes a nonvolatile memory 210, a memory controller 220, a RAM 230, and a power generator 240.

The nonvolatile memory 210 can perform write, read, and erase operations according to a control of the memory controller 220. The nonvolatile memory 210 can exchange first data DATA1 with the memory controller 220. For example, the nonvolatile memory 210 can receive write data from the memory controller 220 and can write the write data in the nonvolatile memory 210. For example, the nonvolatile memory 210 can perform a read operation and output the read data to the memory controller 220.

The nonvolatile memory 210 can receive first data DATA1, a first command CMD1, and a first address ADDR1. The nonvolatile memory 210 can exchange a control signal CTRL with the memory controller 220. For example, the nonvolatile memory 210 can receive at least one of a chip select signal nCE selecting at least one chip of a plurality of semiconductor chips constituting the nonvolatile memory 210, a command latch enable signal CLE indicating that a signal being received from the memory controller 220 is a first command CMD1, an address latch enable signal ALE indicating that a signal being received from the memory controller 220 is a first address ADDR1, a read enable signal nRE which is received from the memory controller 220 in a write operation and can be used to set the timing, and a data strobe signal DQS used to set an input sync of the first data DATA1 from the memory controller 220.

For example, the nonvolatile memory 210 can output at least one of a ready/busy signal (R/nB) indicating that the nonvolatile memory 210 is performing a program, erase, or read operation and a data strobe signal DQS being used to set an output sync of first data DATA1 to the memory controller 220.

The nonvolatile memory 210 may include/be a flash memory. However, the nonvolatile memory 210 is not limited to a flash memory. The nonvolatile memory 210 may include at least one of various nonvolatile memories such as a PRAM (phase change RAM), a MRAM (magnetic RAM), a RRAM (resistive RAM), a FeRAM (ferroelectric RAM), etc.

The memory controller 220 is configured to control the nonvolatile memory 210. For example, the memory controller 220 may control the nonvolatile memory 210 to perform write, read, and/or erase operations. The memory controller 220 can exchange first data DATA1 and a control signal CTRL with the nonvolatile memory 210 and can output a first command CMD1 and a first address ADDR1 to the nonvolatile memory 210.

The memory controller 220 can control the nonvolatile memory 210 according to a control of the host device 100. The memory controller 220 can exchange second data DATA2 with the host device 100 and can receive a second command CMD2, a second address ADDR2, and the power saving mode signal PMS from the host device 100. Thus, the power saving mode signal PMS may be generated external to the memory controller 220.

The memory controller 220 can receive second data DATA2 from the host device 100 and write the second data DATA2 in the nonvolatile memory 110 as the first data DATA1. The memory controller 220 can receive first data DATA1 from the nonvolatile memory 210 and output the first data DATA1 to the host device 100 as the second data DATA2. The memory controller 220 can exchange first data DATA1 with the nonvolatile memory 210 as a first unit and exchange second data DATA2 with the host device 100 as a second unit different from the first unit.

The memory controller 220 can exchange first data DATA1 with the nonvolatile memory 210 and transmit a first command CMD1 and a first address ADDR1 to the nonvolatile memory 210. The memory controller 220 can exchange second data DATA2 with the host device 100 and receive a second command CMD2 and second data DATA2 from the host device 100. The memory controller 220 can exchange third data DATA3 with the RAM 230 and output a third command CMD3 and a third address ADDR3 to the RAM 230.

The third data DATA3 being provided from the memory controller 220 may be the second data DATA2 provided from the host device 100. That is, the memory controller 220 can transmit the second data DATA2 provided from the host device 100 to the RAM 230.

The third data DATA3 being provided from the memory controller 220 may be the first data DATA1 provided from the nonvolatile memory 210. That is, the memory controller 220 can transmit the first data DATA1 provided from the nonvolatile memory 210 to the RAM 230.

The third data DATA3 being provided from the memory controller 220 may be a cache memory included in the memory controller 220 or data stored in an operation memory.

The memory controller 220 can transmit data stored in the RAM 230 to the nonvolatile memory 210 as the first data DATA1 or transmit it to the host device 100 as the second data DATA2.

According to some embodiments of the present inventive concepts, the memory controller 220 can receive the power saving mode signal PMS from the host device 100. In response to the power saving mode signal PMS, the memory controller 220 can store the first data DATA1 read from the nonvolatile memory 210 and the second data DATA2 being received from the host device 100 in the RAM 230 during a predetermined period. In response to the power saving mode signal PMS, the memory controller 220 can store the third data DATA3 in the RAM 230 during the predetermined period. The memory controller 220 may include a cache memory, an operation memory, and a buffer memory that store the third data DATA3.

The RAM 230 may include one of various volatile memories such as a DRAM, a SRAM, a SDRAM, etc. The RAM 230 can be embodied by a DRAM.

The power generator 240 can receive the power saving mode signal PMS from the host device 100. The power generator 240 can output the first power P1 to the memory controller 220 in response to deactivation of the power saving mode signal PMS. The power generator 240 can output the second power P2 to the nonvolatile memory 210 in response to deactivation of the power saving mode signal PMS. The power generator 240 can output the third power P3 to the RAM 230 in response to deactivation of the power saving mode signal PMS.

The power saving mode signal PMS may be used to reduce power consumption of the computing system 10. In a low power mode in which the power saving mode signal PMS is activated, power supplied to the nonvolatile memory 210 and the memory controller 220 may be cut off. In a low power mode in which the power saving mode signal PMS is activated, the RAM 230 may be continuously supplied with power to maintain data. In a low power mode, the RAM 230 can perform a self refresh on a plurality of banks to maintain data. Thus, power consumption due to a self refresh operation of the banks may occur.

According to some embodiments of the present inventive concepts, in a low power mode, the computing system 10 can perform a self refresh only on a designated bank among the banks included in the RAM 230. That is, power consumption being used in the RAM 230 may be reduced by performing a self refresh only on a designated bank among the banks.

Figure 2:
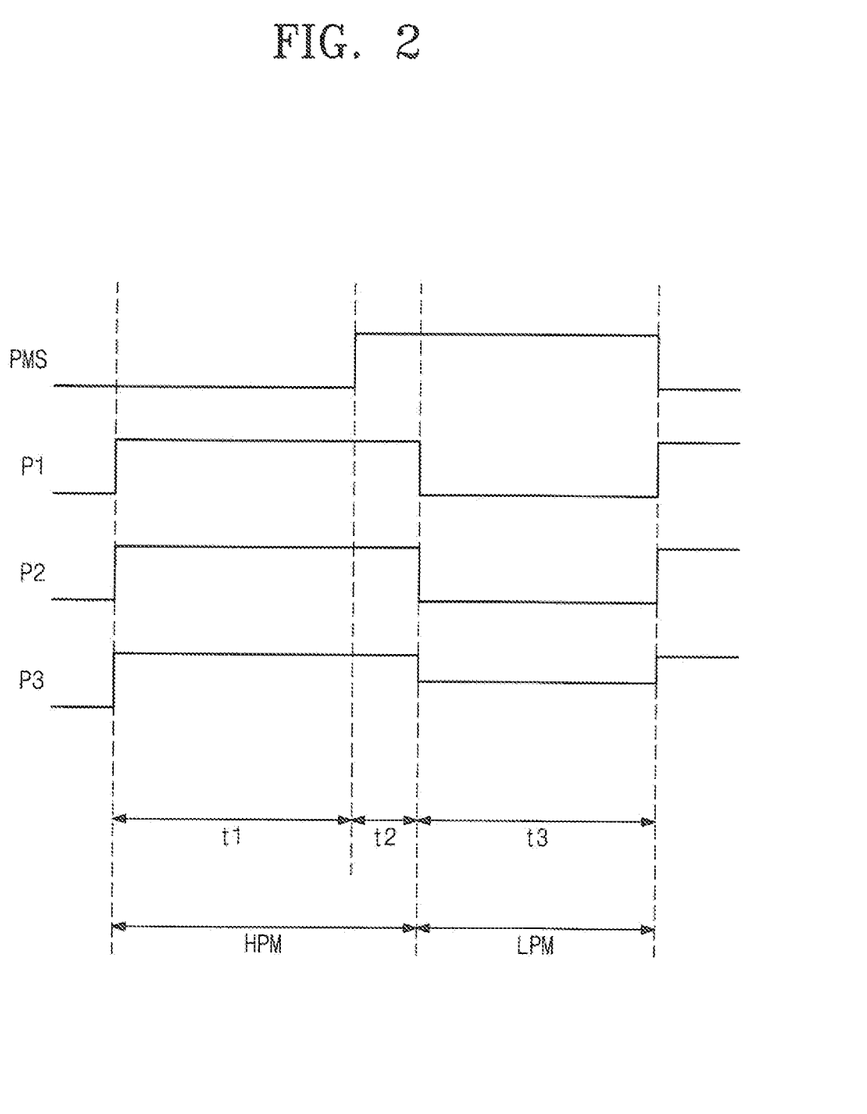
FIG. 2 is a timing diagram illustrating an operation of power generators illustrated in FIG. 1 in a tow power mode.

FIG. 2 is a timing diagram illustrating an operation of a power generator illustrated in FIG. 1 in a low power mode.

Referring to FIGS. 1 and 2, the computing system 10 may provide a high power mode RPM in which all the constituent elements operate and a low power mode LPM in which some constituent elements operate to reduce power consumption.

In first and second periods (t1, t2), the data storage device 200 operates in a high power mode RPM and power consumption due to all the constituent elements may occur. In a first period (t1), the power generator 240 supplies first power P1 to the nonvolatile memory 210, second power P2 to the memory controller 220 and third power P3 to the RAM 230 in response to deactivation of the power saving mode signal PMS.

In a second period (t2), to embody low power, the host device 100 can transition the power saving mode signal PMS from a deactivation state to an activation state. As the power saving mode signal PMS is activated, the memory controller 220 can store unrestorable data in the RAM 230 during the predetermined period. The unrestorable data may be write data not stored in the nonvolatile memory 210 or operation data of the nonvolatile memory 210. The second period (t2) may be time until data is stored in the RAM 230 under the control of the memory controller 220 after the power saving mode signal PMS transitions from a deactivation state to an activation state.

As the power saving mode signal PMS transitions to an activation state, the memory controller 220 can store second data DATA2 received from the host device 100 in the RAM 230 during the predetermined period.

As the power saving mode signal PMS transitions to an activation state, the memory controller 220 can store data of a cache memory and an operation memory included in the memory controller 220 in the RAM 230 during the predetermined period. Data stored in the cache memory and the operation memory may be data needed in an operation of the memory controller 220.

In a third period (t3), the data storage device 200 operates in a low power mode LPM and power consumption due to some constituent elements of the computing system 10 may occur. For example, in a low power mode LPM, power due to the RAM 230 may be consumed.

In the third period (t3), after the predetermined period (t2) in which the memory controller 220 stores data in the RAM 230, the power generator 240 can cut off a supply of first power P1 and second power P2. That is, the power generator 240 may not supply first and second powers P1 and P2 to the nonvolatile memory 210 and the memory controller 220 during a low power mode LPM.

The power generator 240 can supply third power P3 to the RAM 230 in a low power mode. According to some embodiments of the present inventive concepts, the RAM 230 may perform a self refresh only on some designated banks among a plurality of banks. That is, power usage of the RAM 230 can be determined depending on the number of banks performing a self refresh among the banks.

Figure 3:
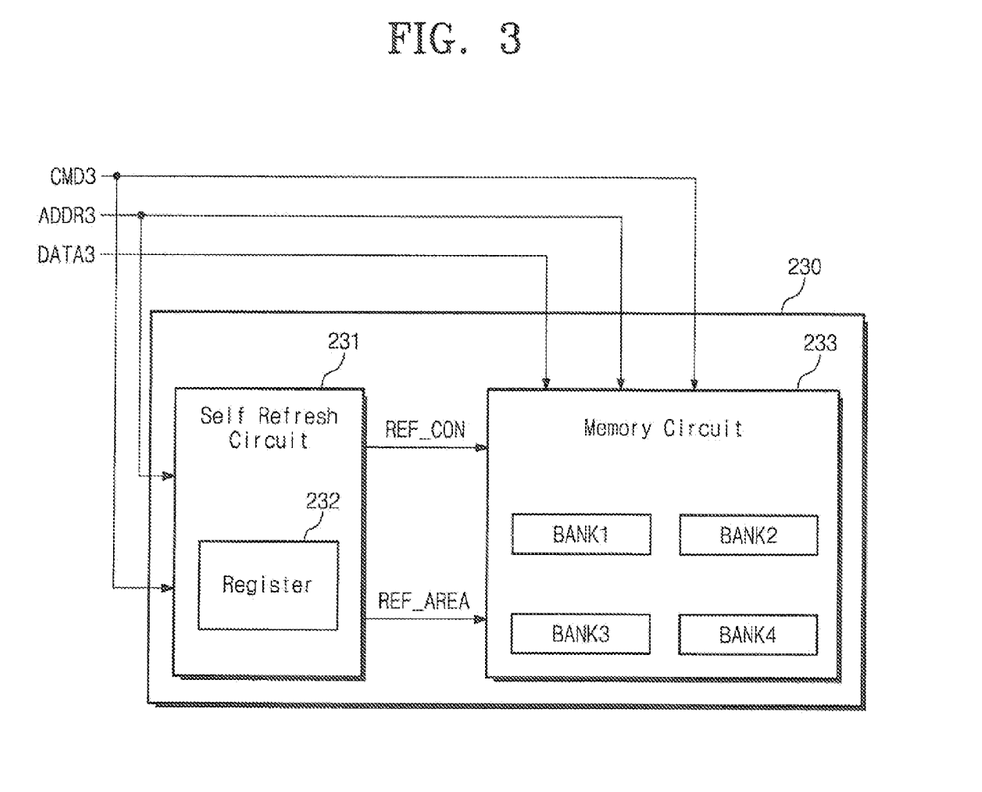
FIG. 3 is a block diagram illustrating DRAMs illustrated in FIG. 1.

FIG. 3 is a block diagram illustrating DRAMs illustrated in FIG. 1.

Referring to FIG. 3, the RAM 230 can include a self refresh circuit 231 and a memory circuit 233. As described in FIG. 1, the RAM 230 may be embodied by a DRAM. A self refresh is a kind of a refresh operation and is a refresh operation that the RAM 230 autonomously has to perform periodically in a low power mode LPM to maintain data stored in a memory cell capacitor. According to some embodiments of the present inventive concepts, in a low power mode LPM, the RAM 230 may not perform a self refresh on the whole bank but may perform a partial self refresh.

The self refresh circuit 231 may receive a third command CMD3 and a third address signal ADDR3 from the memory controller 220. The self refresh circuit 231 may generate a refresh control signal REF_CON and a refresh area signal REF_AREA in response to the third command CMD3 and the third address signal ADDR3.

According to some embodiments of the present inventive concepts, the third command CMD3 may include a self refresh command signal, and first and second write command signals. The memory controller 220 can output a self refresh command signal determining an activation state of the refresh control signal REF_CON and can output first and second write command signals to write data in the memory circuit 233 in the third command CMD3.

In the case that a first write command signal is output to the self refresh circuit 231 as the third command CMD3, the refresh control signal REF_CON may be output to the memory circuit 233 in a deactivation state. In this case, the self refresh circuit 231 can store information of a bank which can perform a self refresh according to the third address signal ADDR3 in a register in response to the first write command signal. In the case that a second write command signal is output to the memory circuit 233 as a third command CMD3, the memory circuit 233 can perform data read and write operations in response to the second write command, the third address signal ADDR3, and the third data signal DATA3. Since read and write operations of data of the memory circuit 233 are well known to those skilled in the art, a detailed description thereof will be omitted.

In the case that a self refresh command signal is output to the self refresh circuit 231 as the third command CMD3, the refresh control signal REF_CON may be output to the memory circuit 233 in an activation state. In this case, the self refresh circuit 231 can generate a refresh area signal REF_AREA based on information of a bank stored in a register. The self refresh circuit 231 can output the generated refresh area signal REF_AREA to the memory circuit 233. The memory circuit 233 can perform a self refresh of banks corresponding to the refresh area signal REF_AREA according to an activation state of the refresh control signal REF_CON. The refresh area signal REF_AREA may be a signal designating a bank performing a refresh operation among a plurality of banks, such as among first through fourth banks BANK1-BANK4 illustrated in FIG. 3.

When the third command CMD3 is output to the memory circuit 233 as a self refresh command signal, the memory circuit 233 operates in response to the refresh control signal REF_CON and the refresh area signal REF_AREA.

The memory circuit 233 can include the first through fourth banks BANK1-BANK4. Each bank may include a plurality of memory cells. However, the present inventive concepts are not limited thereto, and the memory circuit 233 may include a plurality of banks.

The self refresh circuit 231 may include a register 232. The register 232 can store information of banks performing a refresh among the plurality of banks, such as among the first through fourth banks BANK1-BANK4.

Figure 4:
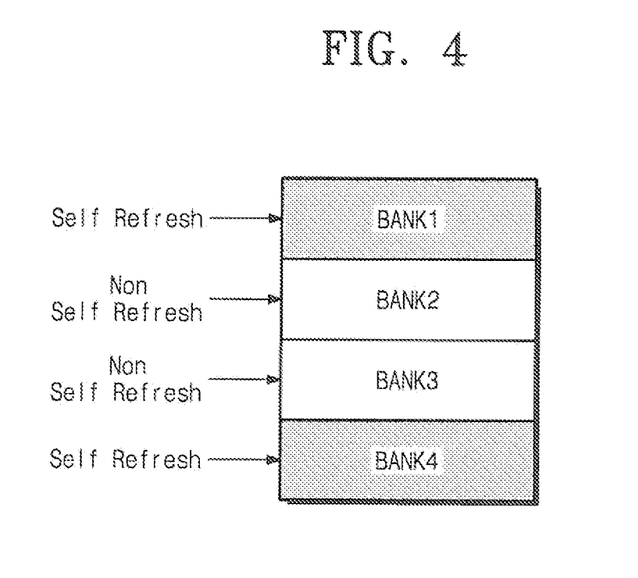
FIG. 4 is a table illustrating a bank performing a self refresh among a plurality of banks illustrated in FIG. 3 in accordance with some embodiments of the present inventive concepts.
Figure 5:
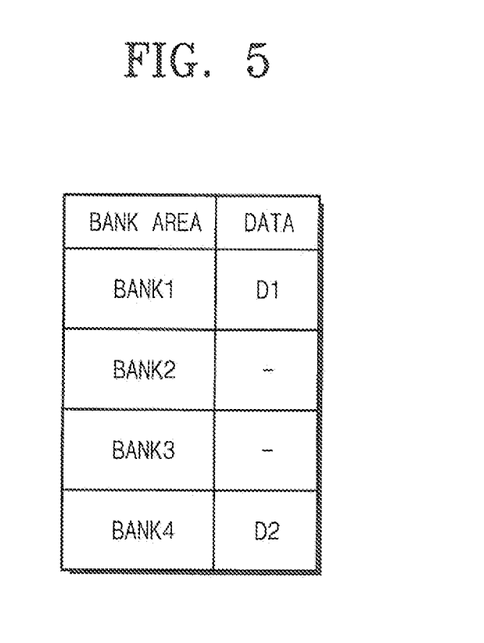
FIG. 5 is a table illustrating data stored in a RAM according to a designated bank in FIG. 4 in accordance with some embodiments of the present inventive concepts.

FIG. 4 is a table illustrating a bank performing a self refresh among a plurality of banks illustrated in FIG. 3 in accordance with some embodiments of the present inventive concepts. FIG. 5 is a table illustrating data stored in a RAM according to a designated bank in FIG. 4 in accordance with some embodiments of the present inventive concepts.

Referring to FIGS. 3 and 4, the memory controller 220 can designate a bank performing a self refresh among the first through fourth banks BANK1-BANK4. For example, the memory controller 220 can designate a bank performing a self refresh in a second period (t2) in which the power saving mode signal PMS transitions from a deactivation state to an activation state. The memory controller 220 can designate the number of banks that will perform a self refresh depending on a size of the RAM 230. The memory controller 220 can generate the third command CMD3 and the third address ADDR3 during the second period (t2) based on the designated bank information.

The memory controller 220, as illustrated in FIG. 4, can designate first and fourth banks BANK1 and BANK4 as banks performing a self refresh. Thus, in a low power mode LPM, the first and fourth banks BANK1 and BANK4 can perform a self refresh but second and third banks BANK2 and BANK3 may not perform a self refresh. The first and fourth banks BANK1 and BANK4 may be designated as banks performing a self refresh but the present inventive concepts are not limited thereto.

Referring to FIGS. 3 and 5, during the second period (t2), the memory controller 220 can output the third command CMD3 and the third address signal ADDR3 to the RAM 230. During the second period (t2), the RAM 230 can store third data DATA3 in the first and fourth banks BANK1 and BANK4 designated from the memory controller 220 in response to the third command CMD3 and the third address signal ADDR3. In this case, the RAM 230 may not store data in the second and third banks BANK2 and BANK3. The RAM 230 can store the third data DATA3 in the designated first and fourth banks BANK1 and BANK4 during a deactivation state of the refresh control signal REF_CON.

Figure 6:
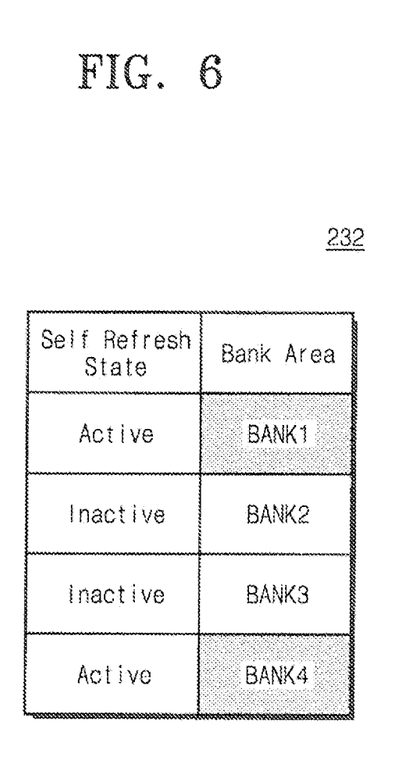
FIG. 6 is a table illustrating state information of registers illustrated in FIG. 3 in accordance with some embodiments of the present inventive concepts.

FIG. 6 is a table illustrating state information of registers illustrated in FIG. 3 in accordance with some embodiments of the present inventive concepts.

Referring to FIGS. 3 through 6, the register 232 can receive a third command CMD3 and a third address signal ADDR3 during a second period (t2). The register 232 can store information of each of the first through fourth banks BANK1-BANK4 in response to the third command CMD3 and the third address signal ADDR3. The register 232 can store a self refresh state in accordance with each bank area in response to the third command CMD3 and the third address signal ADDR3.

The self refresh circuit 231 can output a refresh area signal REF_AREA controlling so that a self refresh is performed in a low power mode LMP based on the information of the bank stored in the register 232.

The register 232 can store information of the first bank BANK1 in response to the third command CMD3 and the third address signal ADDR3. In this case, the register 232 can store the information of the first bank BANK1 designated to perform a self refresh as an activation state according to the third address signal ADDR3.

The register 232 can store information of the second bank BANK2 in the register 232 in response to the third command CMD3 and the third address signal ADDR3. In this case, the register 232 can store information of the second bank BANK2 designated not to perform a self refresh as a deactivation state in response to the third address signal ADDR3.

The register 232 can store information of the third bank BANK3 in response to the third command CMD3 and the third address signal ADDR3. In this case, the register 232 can store the information of the third bank BANK3 designated not to perform a self refresh as a deactivation state according to the third address signal ADDR3.

The register 232 can store information of the fourth bank BANK4 in response to the third command CMD3 and the third address signal ADDR3. In this case, the register 232 can store information of the fourth bank BANK4 designated to perform a self refresh as an activation state according to the third address signal ADDR3.

Figure 7:
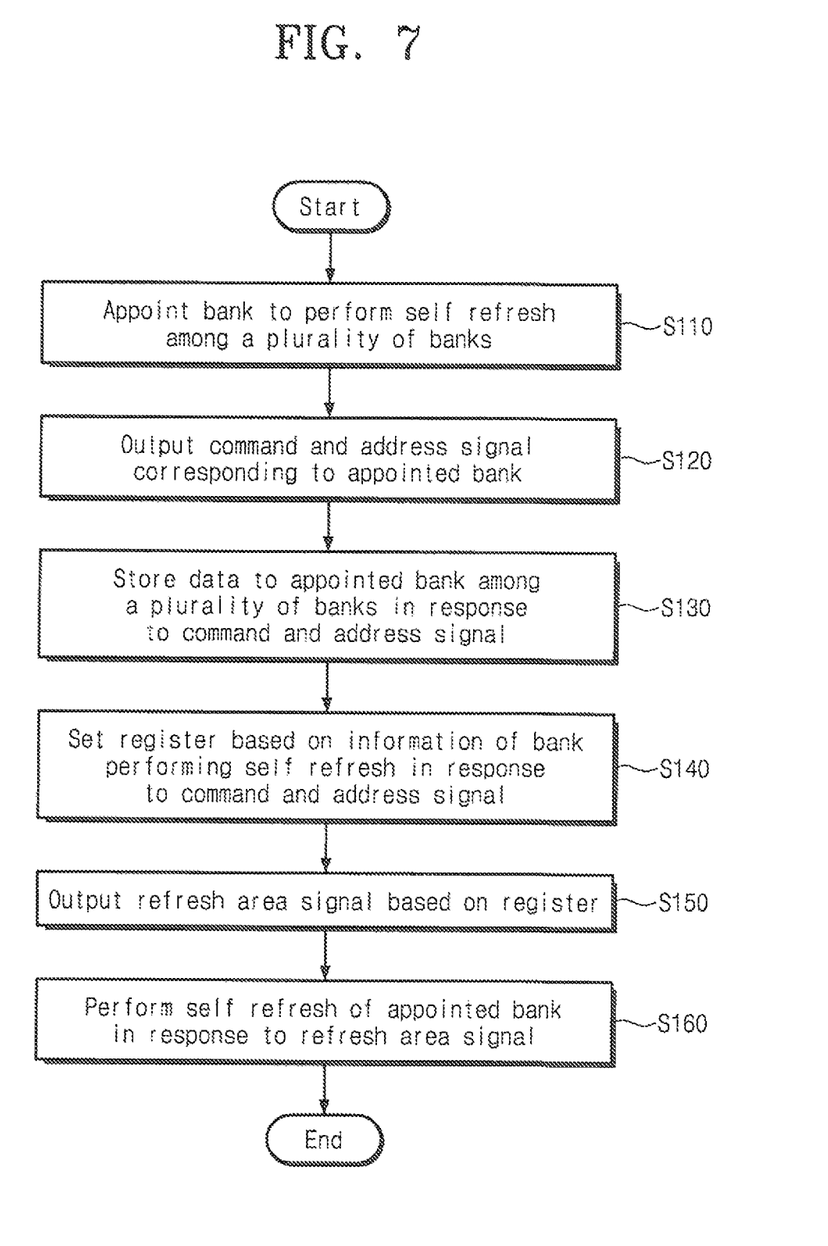
FIG. 7 is a flow chart illustrating an operation of computing systems in accordance with some embodiments of the present inventive concepts.

FIG. 7 is a flow chart illustrating an operation of computing systems in accordance with some embodiments of the present inventive concepts.

As described in FIG. 2, the data storage device 200 may be driven in a high power mode HPM or a low power mode LPM according to a level of the power saving mode signal PMS. In the high power mode HPM, the data storage device 200 may be driven in a normal operation mode. In the low power mode LPM, the data storage device 200 may be driven in a power saving operation mode.

Referring to FIGS. 3 and 7, in a step S110, as the power saving mode signal PMS transitions from a deactivation mode to an activation mode, the memory controller 220 can designate a bank performing a self refresh among a plurality of banks. The memory controller 220 can store information of the designated bank in a cache memory.

In a step S120, the memory controller 220 can output a third command CMD3, third address signal ADDR3, and third data DATA3 corresponding to the designated bank to the memory circuit 233.

In a step S130, the memory circuit 233 can store the third data DATA3 in the designated bank in response to the third command CMD3 and the third address signal ADDR3 output from the memory controller 220. The third command CMD3 may be a write command signal. In this case, the self refresh circuit 231 can output the refresh control signal REF_CON of a deactivation state to the memory circuit 233. That is, in the case that the refresh control signal REF_CON is in a deactivation state, the memory circuit 233 may not perform a self refresh.

In a step S140, the self refresh circuit 231 can set the register 232 based on information of banks performing a self refresh in response to the third command CMD3 and the third address signal ADDR3 output from the memory controller 220. The third command CMD3 may be the first write command signal described in FIG. 3. After the step S130 in which the memory circuit 233 can store the third data DATA3 in the designated bank, the step S140 of setting the register 232 can be performed. However, the present inventive concepts are not limited thereto. That is, after the step S120, the step S130 or the step S140 may be performed.

In a step S150, the self refresh circuit 231 can output a refresh area signal REF_AREA based on the set register 232.

In a step S160, the memory circuit 233 can perform a self refresh of the designated bank in response to the refresh area signal REF_AREA. In this case, the self refresh circuit 231 can output the refresh control signal REF_CON of an activation state to the memory circuit 233.

After the power saving mode signal PMS transitions from a deactivation state to an activation state, the steps S110 through S140 may be performed during the predetermined period. That is, the memory controller 220 can store data not stored in the memory circuit 233 in the RAM 230 during the predetermined period. After the power saving mode signal PMS transitions from a deactivation state to an activation state and then the predetermined period elapses, the power generator 240 can halt a power supply of the memory controller 220 and the nonvolatile memory 210.

Figure 8:
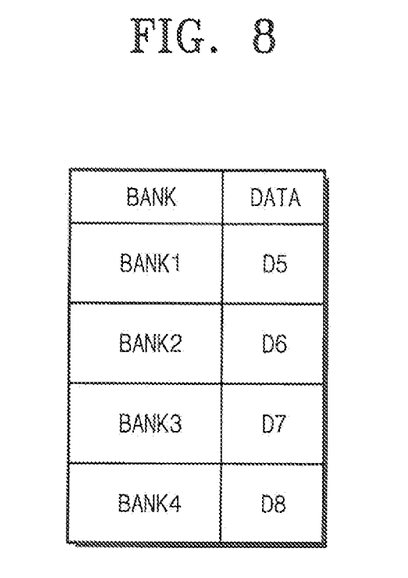
FIG. 8 is a table illustrating data stored in a plurality of banks in accordance with some embodiments of the present inventive concepts.
Figure 9:
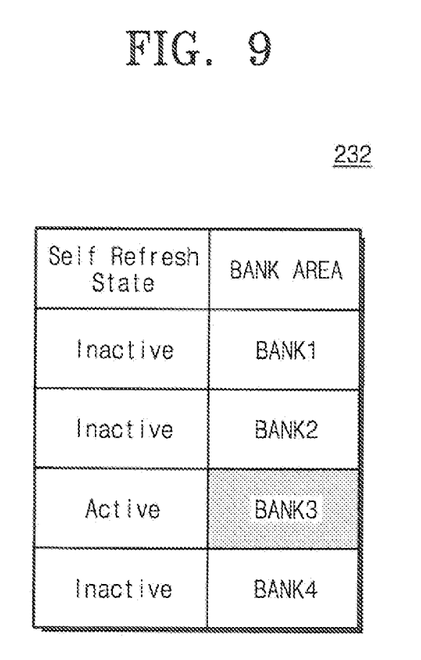
FIG. 9 is a table illustrating state information of registers illustrated in FIG. 3 in accordance with some embodiments of the present inventive concepts.

FIG. 8 is a table illustrating data stored in a plurality of banks in accordance with other embodiments of the present inventive concepts. FIG. 9 is a table illustrating state information of a register 232 illustrated in FIG. 3 in accordance with other embodiments of the present inventive concepts.

Referring to FIGS. 3 and 8, the memory circuit 233 stores fifth data D5 in the first bank BANK1, sixth data D6 in the second bank BANK2, seventh data D7 in the third bank BANK3 and eighth data D8 in the fourth bank BANK4.

Referring to FIGS. 3, 8, and 9, in the case that data is stored in each bank of the memory circuit 233, the memory controller 220 can store a bank performing a self refresh with reference to data of each of the banks. That is, the memory controller 220 can output the third command CMD3 and the third address ADDR3 to the self refresh circuit 231 with reference to data stored in each bank.

Data included in the memory circuit 233 may include unrestorable data and restorable data. A bank including unrestorable data may need a self refresh and a bank including restorable data may not need a self refresh. Thus, in case of referring to data stored in each bank, the memory controller 220 can refer to unrestorable data.

For example, the register 232 can store information of the first through fourth banks BANK1-BANK4. It is described that the third bank BANK3 can include unrestorable data among data stored in the first through fourth banks BANK1-BANK4. The memory controller 220 can designate the third bank BANK3 including unrestorable data D7 among the first through fourth banks BANK1-BANK4 as a bank performing a self refresh. The memory controller 220 can generate the third command CMD3 and the third address signal ADDR3 based on the designated third bank BANK3.

The self refresh circuit 231 can store information of the third bank BANK3 in the register 232 in response to the third command CMD3 and the third address signal ADDR3. That is, the self refresh circuit 231 can store the third bank BANK3 in an activation state performing a self refresh.

As described above, a bank performing the self refresh described in FIG. 5 can be designated and unrestorable data can be stored in the designated bank. However, according to some other embodiments of the present inventive concepts, the data storage device 200 can refer to data included in the memory circuit 233 and can designate a bank performing a self refresh on the basis of referenced data.

Figure 10:
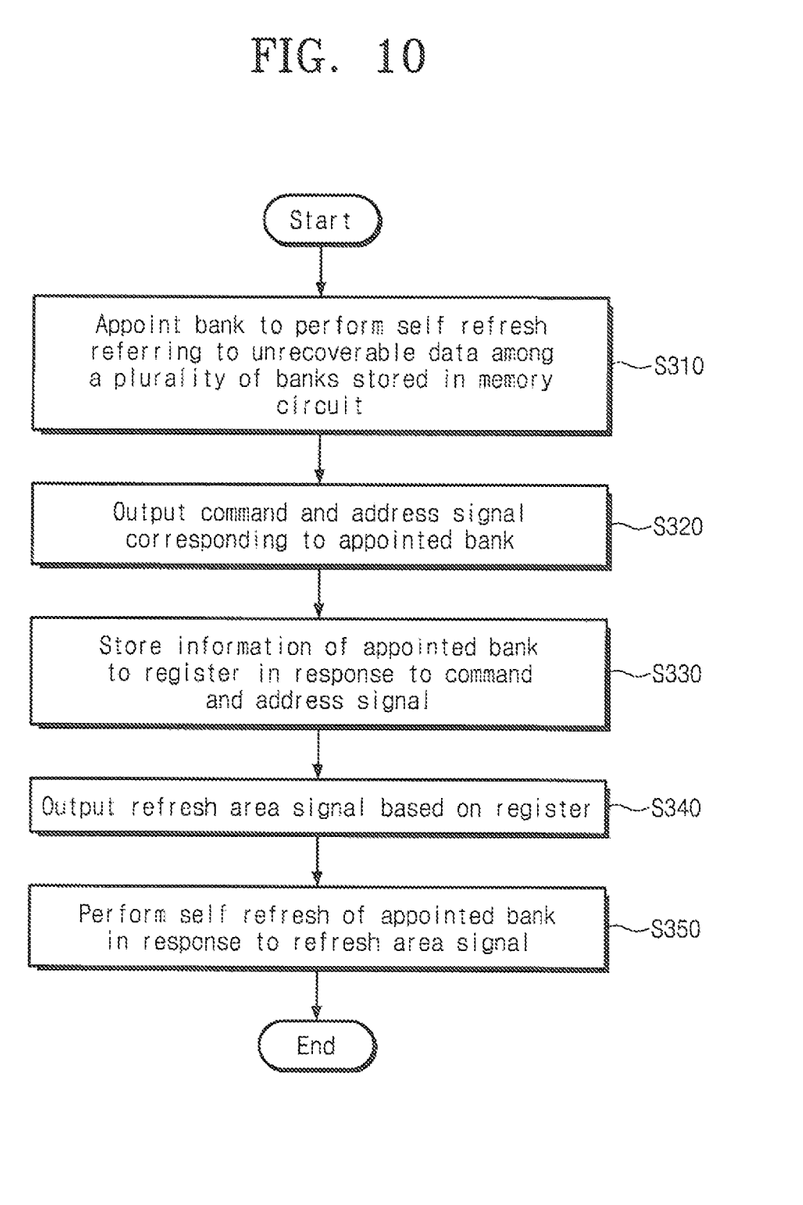
FIG. 10 is a flow chart illustrating an operation of computing systems in accordance with some embodiments of the present inventive concepts.

FIG. 10 is a flow chart illustrating an operation of computing systems in accordance with other embodiments of the present inventive concepts. Referring to FIGS. 1, 3, and 10, in a step S310, the memory controller 220 can designate a bank that will perform a self refresh with reference to unrestorable data stored in each bank of the memory circuit 233.

In a step S320, the memory controller 220 can output the third command CMD3 and the third address signal ADDR3 corresponding to the designated bank.

In a step S330, the self refresh circuit 231 can store information of the designated bank in a register 232 in response to the third command CMD3 and the third address signal ADDR3 output from the memory controller 220.

In a step S340, the self refresh circuit 231 can output a refresh area signal REF_AREA on the basis of the register 232.

In a step S350, the memory circuit 233 can perform a self refresh of the designated bank in response to the refresh area signal REF_AREA. In this case, the self refresh circuit 231 can output the refresh control signal REF_CON of an activation state to the memory circuit 233.

After the power saving mode signal EMS transitions from a deactivation state to an activation state, the steps S310 through S330 may be performed during the predetermined period.

Figure 11:
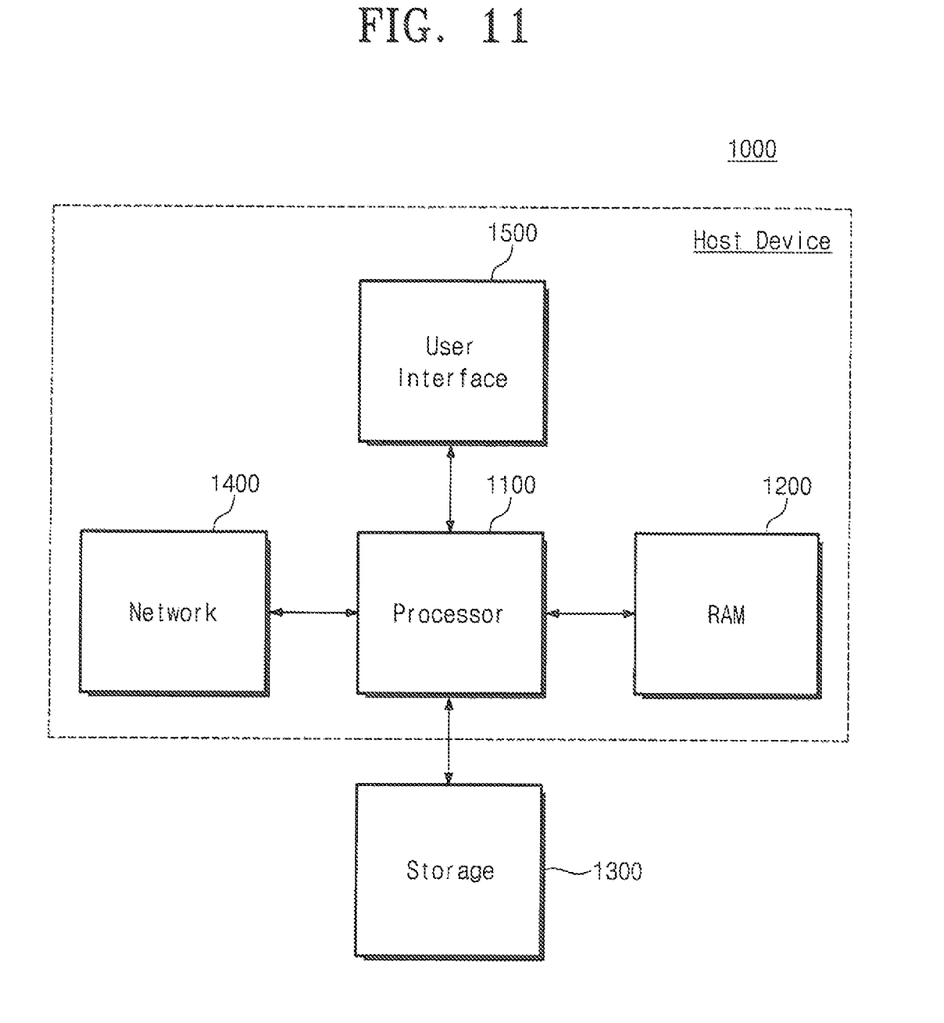
FIG. 11 is a block diagram illustrating computing devices in accordance with examples of applications of the present inventive concepts.

FIG. 11 is a block diagram illustrating computing devices in accordance with an application example of the present inventive concepts. Referring to FIG. 11, a computing device 1000 can include a processor 1100, a RAM 1200, a data storage device 1300, a network 1400 and a user interface 1500.

The processor 1100 can control an overall operation of the computing device 1000 and perform a logical operation. For example, the processor 1100 can comprise a system-on-chip SoC. The processor 1100 may be a general purpose processor, a special purpose processor, or an application processor.

The RAM 1200 can communicate with the processor 1100. The RAM 1200 may be a main memory of the processor 1100 or the computing device 1000. The processor 1100 can temporarily store a code or data in the RAM 1200. The processor 1100 can execute a code and process data using the RAM 1200. The processor 1100 can execute various software such as an operating system, an application, etc. using the RAM 1200. The processor 1100 can control an overall operation of the computing device 1000 using the RAM 1200.

The RAM 1200 may include a volatile memory such as a SRAM, a DRAM, a SDRAM, etc. and a nonvolatile memory such as a PRAM, a MRAM, an RRAM, a FeRAM, etc.

The data storage device 1300 can communicate with the processor 1100. The data storage device 1300 can store data which has to be stored for a long time. That is, the processor 1100 can store data which has to be stored for a long time in the data storage device 1300. The data storage device 1300 can store a boot image to drive the computing device 1000. The data storage device 1300 can store executable code of various software such as an operating system, an application, etc. The data storage device 1300 can store data processed by various software such as an operating system, an application, etc.

The processor 1100 can drive various software such as an operating system, an application, etc. by loading executable code stored in the data storage device 1300 in the RAM 1200 and executing the code loaded in the RAM 1200. The processor 1100 can load data stored in the data storage device 1300 in the RAM 1200 and process data loaded in the RAM 1200. The processor 1100 can store data desired to be preserved for a long time among data stored in the RAM 1200 in the data storage device 1300.

The data storage device 1300 may include a nonvolatile memory such as a flash memory, a PRAM, a MRAM an RRAM, a FeRAM, etc.

The network 1400 can perform a communication with an external device according to a control of the processor 1100. For example, the network 1400 can perform a wired or wireless communication with an external device. The network 1400 can perform a communication based on at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (REID), or at least one of various wired communication methods such as a universal serial bus (USB), a serial AT attachment (SATA), a small computer system interface (SCSI), a Firewire (IEEE 1394), a peripheral component interconnection (PCI), a PCI express (PCIe), a nonvolatile memory express (NVMe), a universal flash storage (UFS), a secure digital (SD), a SDIO, a universal asynchronous receiver transmitter (UART), a SPI (serial peripheral interface), a high speed SPI (HS-SP1), a RS232, an inter-integrated circuit (I2C), a HS-I2C, an integrated-interchip sound (I2S), a Sony/Philips Digital Interface (S/PDIF), a multimedia card (MMC), an embedded MMC (eMMC), etc.

The user interface 1500 can communicate with a user under the control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, etc. The user interface 1500 may include user output interfaces such as a liquid crystal display (LCD), an organic light emitting diode (OLED) display, an active matrix OLED (AMOLED) display, a LED, a speaker, a monitor, etc.

The data storage device 1300 may be embodied by the data storage device 200 in accordance with some embodiments of the present inventive concepts. The processor 1100, the RAM 1200, the network 1400 and the user interface 1500 may form a host device communicating with the data storage device 1300.

According to some embodiments of the present inventive concepts, a solid state drive can include a DRAM performing a self refresh only on a designated bank among a plurality of banks. Thus, the whole power consumption of the solid state drive may be reduced.

The foregoing is illustrative of the present inventive concepts and is not to be construed as limiting thereof. Although a few embodiments of the present inventive concepts have been described, those skilled in the art will readily appreciate that many modifications are possible in the embodiments without materially departing from the novel teachings and advantages of the present inventive concepts. Accordingly, all such modifications are intended to be included within the scope of the present inventive concepts as defined in the claims. The present inventive concepts are defined by the following claims, with equivalents of the claims to be included therein.

What is claimed is:

1. A method of operating a solid state drive, wherein the solid state drive comprises a nonvolatile memory, a volatile memory, a memory controller controlling the nonvolatile memory and the volatile memory, and a power generator providing power to the nonvolatile memory, the volatile memory, and the memory controller, wherein the method of operating the solid state drive comprises:
designating a bank to perform a self refresh among a plurality of banks included in the volatile memory in response to a power saving mode signal;
storing information of the designated bank in a register in response to a command and an address signal;
cutting off power from the power generator to the memory controller and the nonvolatile memory after the power saving mode signal is activated and then a predetermined time has elapsed; and
performing a self refresh of the designated bank based on the information stored in the register.

2. The method of operating a solid state drive of claim 1, further comprising:
storing data in the designated bank among the plurality of banks in response to the command and the address signal.

3. The method of operating a solid state drive of claim 1, further comprising:
outputting the command and the address signal from the memory controller, and
designating, as the power saving mode signal is activated, a bank to perform the self refresh among the plurality of banks.

4. The method of operating a solid state drive of claim 1, wherein designating comprises:
detecting a bank including unrestorable data among the plurality of banks included in the volatile memory in response to the power saving mode signal; and
determining a bank to perform the self refresh among the plurality of banks on the basis of the detection result.

5. The method of operating a solid state drive of claim 4, further comprising:
outputting the command and the address signal and setting the register according to the address signal.

6. A solid state drive comprising:
a nonvolatile memory;
a volatile memory comprising a plurality of banks, wherein the volatile memory is configured to perform a self refresh on a designated bank among the plurality of banks in response to a command and an address signal;
a memory controller configured to control write, read, and erase operations of the nonvolatile memory, designate the bank to perform a self refresh among the plurality of banks in response to a power saving mode signal, and output the command and the address signal on the basis of the designated bank; and
a power generator configured to supply power to the memory controller, the nonvolatile memory, and the volatile memory according to the power saving mode signal,
wherein the volatile memory comprises:

a self refresh circuit configured to output a refresh control signal and a refresh area signal in response to the command and the address signal; and a memory circuit configured to perform a self refresh on the designated bank in response to the refresh control signal and the refresh area signal.

7. The solid state drive of claim 6, wherein the self refresh circuit comprises a register configured to store information of the designated bank.

8. The solid state drive of claim 7, wherein the command comprises a self refresh command signal and a write command signal, and wherein the self refresh circuit is configured to output the refresh control signal in an activation state in response to the self refresh command signal and a deactivation state in response to the write command signal.

9. The solid state drive of claim 8, wherein the write command signal comprises first and second write command signals, and wherein the first write command signal is output to the self refresh circuit and the second write command signal is output to the memory circuit.

10. The solid state drive of claim 9, wherein the self refresh circuit is configured to set the register according to the address signal in response to the first write command signal.

11. The solid state drive of claim 9, wherein the memory controller is further configured to output data to the memory circuit, wherein the memory circuit is configured to store the data output from the memory controller in the designated bank according to the address signal in response to the second write command signal.

12. The solid state drive of claim 6, wherein after the power saving mode signal is activated and then a predetermined time has elapsed, the power generator is configured to cut off power of the memory controller and the nonvolatile memory.

13. The solid state drive of claim 12, wherein the memory controller is configured to back up data to the designated bank during the predetermined time.

14. A memory device comprising:
a memory circuit comprising a plurality of memory banks of volatile memory; and
a self refresh circuit configured to provide a refresh signal to the memory circuit,
wherein the self refresh circuit is configured to determine a selected memory bank of the plurality of memory banks for a self refresh operation to refresh data of the selected memory bank, and
wherein, responsive to the refresh signal, the memory circuit is configured to provide a self refresh operation to refresh data of the selected bank and to not provide a self refresh operation to an unselected bank of the plurality of memory banks,
wherein the refresh signal comprises a refresh control signal and a refresh area signal,
wherein the refresh control signal determines an activation state or a deactivation state of the self refresh operation of the volatile memory device,
wherein the refresh area signal is a signal designating the selected bank of the plurality of memory banks for the self refresh operation to refresh data of the selected memory bank,
wherein the self refresh circuit further comprises a register, and
wherein the register contains data which corresponds to the determination of the selected memory bank of the plurality of memory banks for the self refresh operation to refresh data of the selected memory bank.

15. The memory device of claim 1, wherein the self refresh circuit further comprises an interface to a memory controller, wherein the self refresh circuit stores information in the register responsive to a signal received by the self refresh circuit on the interface to the memory controller.

16. The memory device of claim 15, wherein the signal received by the self refresh circuit on the interface to the memory controller comprises a command signal and an address signal.

* * * * *